(12) United States Patent
Rennie

(10) Patent No.: US 8,350,937 B2
(45) Date of Patent: Jan. 8, 2013

(54) SOLID-STATE IMAGING DEVICE HAVING PIXELS INCLUDING AVALANCHE PHOTODIODES

(75) Inventor: John Rennie, Tokyo (JP)

(73) Assignee: Sony Corporation (JP)

( * ) Notice: Subject to any disclaimer, the term of this patent is extended or adjusted under 35 U.S.C. 154(b) by 394 days.

(21) Appl. No.: 12/655,691

(22) Filed: Jan. 4, 2010

(65) Prior Publication Data

US 2010/0177223 A1 Jul. 15, 2010

(30) Foreign Application Priority Data

Jan. 5, 2009 (JP) ................................ P2009-000283

(51) Int. Cl.
*H04N 3/14* (2006.01)
*H04N 5/335* (2011.01)
*H01L 31/107* (2006.01)

(52) U.S. Cl. .................... 348/294; 257/186; 257/438

(58) Field of Classification Search .................... None
See application file for complete search history.

(56) References Cited

U.S. PATENT DOCUMENTS

| | | | | |
|---|---|---|---|---|
| 4,942,436 A | * | 7/1990 | Vetterling | 257/13 |
| 5,539,221 A | * | 7/1996 | Tsuji et al. | 257/186 |
| 5,744,849 A | * | 4/1998 | Sugawa | 257/438 |
| 5,783,838 A | * | 7/1998 | Kyozuka et al. | 257/21 |
| 6,635,908 B2 | * | 10/2003 | Tanaka et al. | 257/186 |
| 7,271,376 B2 | | 9/2007 | Glasper et al. | |
| 2003/0052390 A1 | * | 3/2003 | Hiraoka et al. | 257/623 |
| 2003/0183855 A1 | * | 10/2003 | Dries et al. | 257/200 |
| 2005/0230706 A1 | * | 10/2005 | Yagyu et al. | 257/186 |
| 2005/0253132 A1 | | 11/2005 | Marshall et al. | |
| 2006/0273421 A1 | * | 12/2006 | Yasuoka et al. | 257/438 |
| 2008/0231738 A1 | * | 9/2008 | Iida | 348/308 |

FOREIGN PATENT DOCUMENTS

| | | |
|---|---|---|
| JP | 9-331051 A | 12/1997 |
| JP | 2002314117 A | 10/2002 |
| JP | 2005-532695 T | 10/2005 |
| JP | 2005-532696 | 10/2005 |
| JP | 2006019360 A | 1/2006 |
| JP | 2008066742 A | 3/2008 |
| JP | 2008235681 A | 10/2008 |
| WO | 2006129427 A1 | 12/2006 |

OTHER PUBLICATIONS

Office Action from Japanese Application No. 2009-000283, dated Nov. 8, 2011.
Office Action from Japanese Application No. 2009-000283, dated Oct. 26, 2010.

* cited by examiner

*Primary Examiner* — Justin P Misleh
(74) *Attorney, Agent, or Firm* — Lerner, David, Littenberg, Krumholz & Mentlik, LLP

(57) ABSTRACT

A solid-state imaging device includes: an avalanche photodiode having a structure including an $n^+$ region, a $p^+$ region, and an avalanche region interposed between the $n^+$ region and the $p^+$ region, all of which are formed to extend in a thickness direction of a semiconductor base; and a pixel repeatedly having the structure of the avalanche photodiode.

6 Claims, 10 Drawing Sheets

SOLID-STATE IMAGING DEVICE HAVING PIXELS INCLUDING AVALANCHE PHOTODIODES

CROSS-REFERENCE TO RELATED APPLICATION

The present application claims priority from Japanese Patent Application No. JP 2009-000283 filed in the Japanese Patent Office on Jan. 5, 2009, the entire content of which is incorporated herein by reference.

BACKGROUND OF THE INVENTION

1. Field of the Invention

The present invention relates to a solid-state imaging device and a camera having the solid-state imaging device.

2. Description of the Related Art

An image sensor is a device which can be applied to various fields such as cameras or video recorders.

The image sensor used as such a device includes many pixels. The entire efficiency of the device is determined depending on a pixel size or a pixel structure.

In a color-image device, by disposing a solid-state absorption color filter material usually including organic materials in the pixels, the types of the pixels are divided into three colors of red, green, and blue.

To improve the efficiency of the pixels, a pixel-size lens is used as the uppermost element. Accordingly, by keeping incident light focused on a light-receiving element of each pixel and causing the pixel to capture the light incident on the pixel as much as possible, the light is caused not to diffuse into the neighboring pixels.

However, with the decrease in size of the camera, there is a need for further reducing the pixel size due to the restriction on optical elements such as camera lenses.

Since the decrease in pixel size reduces the light-receiving efficiency of the pixels and also reduces the volume of a photodiode, a decrease in peak gain of a pixel or a marked decrease in dynamic range of the camera is caused.

From such problems, there is a need for such a pixel design that an excellent response characteristic and a wide dynamic range are obtained under the same exposure conditions.

One method of improving the above-mentioned device is to increase the number of carriers resulting from one photon to more than one.

Some researchers suggested that an avalanche diode having a gain greater than or equal to 10 is used (for example, JP-T-2005-532696 and JP-A-9-331051 ([0006])).

This leads the device to have an excellent response characteristic and a wide response range even under a low light amount condition.

SUMMARY OF THE INVENTION

However, when the structure of the avalanche diode suggested in the past is to be applied to an image sensor, two great problems are caused. One problem is that a high voltage equal to or higher than 30 V is necessary and the other problem is that heat is excessively generated.

To cause an avalanche phenomenon to occur, it is necessary to apply an electric field whose strength is equal to or greater than a predetermined value and to apply a voltage corresponding to the thickness of the avalanche diode and the strength of the electric field. In an impurity-doped silicon substrate with a thickness of 3 μm, it is necessary to apply a voltage equal to or higher than 30 V.

When the applied voltage increases, the high potential is diffused to the neighboring pixels to change the characteristics thereof and the crosstalk acting on a noise may be easily caused.

To prevent the crosstalk with the neighboring pixels, it is necessary to satisfactorily guarantee an insulating isolation region between the pixels and thus the ratio of an active region (a light-receiving portion detecting incident light) in each pixel is reduced. Accordingly, since the incident light intensity is reduced, it is necessary to increase the gain of the avalanche diode by as much.

When heat is excessively generated, the noise increases.

Since the device can be cooled using a Peltier device, it is possible to suppress the generation of heat.

However, when the Peltier device is used, the device increases in size and the power consumption thereof increases.

Thus, it is desirable to provide a solid-state imaging device whose response characteristic is satisfactorily excellent with a small pixel size, and a camera having the solid-state imaging device.

According to an embodiment of the invention, there is provided a solid-state imaging device including: an avalanche photodiode having a structure including an $n^+$ region, a $p^+$ region, and an avalanche region interposed between the $n^+$ region and the $p^+$ region, all of which are formed to extend in a thickness direction of a semiconductor base; and a pixel repeatedly having the structure of the avalanche photodiode.

According to another embodiment of the invention, there is provided a camera for capturing an image, including the solid-state imaging device.

The configurations of the solid-state imaging device and the camera according to the embodiments of the invention include the avalanche photodiode with a structure having the $n^+$ region, the $p^+$ region, and the avalanche region interposed between the $n^+$ region and the $p^+$ region, all of which are formed to extend in the thickness direction of the semiconductor base. That is, the regions (the $n^+$ region, the avalanche region, and the $p^+$ region) of the avalanche photodiode are formed to extend in the thickness direction of the semiconductor base and are deep in the thickness direction of the semiconductor base. Accordingly, it is possible to set the depth of the avalanche region so as to detect light of a wavelength to be detected. It is possible to satisfactorily absorb the incident light to generate plural carriers from photons by the avalanche phenomenon.

Since each pixel repeatedly includes the structure of the avalanche photodiode, the width of the avalanche region interposed between the $n^+$ region and the $p^+$ region in each structure of the avalanche photodiode is less by a half than that in the case where each pixel includes only one structure. Accordingly, it is possible to reduce the applied voltage necessary for causing the avalanche phenomenon. On the other hand, when a comparison is made with the same applied voltage, the electric field applied to the avalanche region can be made to be greater than that in the case with only one structure, thereby increasing the number of carriers generated from one photon.

According to the embodiments of the invention, since the applied voltage necessary for causing the avalanche phenomenon can be reduced, it is possible to suppress generation of a crosstalk with a neighboring pixel or generation of heat. Accordingly, it is not necessary to employ a thick insulating isolation region or a Peltier device and it is thus possible to reduce the size of the pixels of the solid-state imaging device.

Therefore, since the pixel size in the solid-state imaging device including the avalanche photodiode in a pixel can be reduced, it is possible to decrease the size of a camera having the solid-state imaging device or to increase the number of pixels in the solid-state imaging device.

The avalanche photodiode can be applied to a CMOS image sensor with a relatively low driving voltage.

When a comparison is made with the same applied voltage, it is possible to increase the number of carriers generated from one photon in the embodiments of the invention, thereby improving the response performance to the low light intensity.

Therefore, according to the embodiments of the invention, it is possible to improve the sensitivity to a low light intensity level with a wide dynamic range maintained.

DETAILED DESCRIPTION OF PREFERRED EMBODIMENTS

Hereinafter, preferred embodiments (hereinafter, referred to as "embodiments") of the invention will be described in detail with reference to the accompanying drawings.

The embodiments will be described in the following sequence.

1. Outline
2. Solid-state Imaging Device according to First Embodiment
3. Solid-state Imaging Device according to Second Embodiment
4. Solid-state Imaging Device according to Third Embodiment
5. Solid-state Imaging Device according to Fourth Embodiment
6. Solid-state Imaging Device according to Fifth Embodiment
7. Modified Examples
8. Camera 1. Outline The outline of the invention will be described before the embodiments of the invention are described.

Figure 14A:
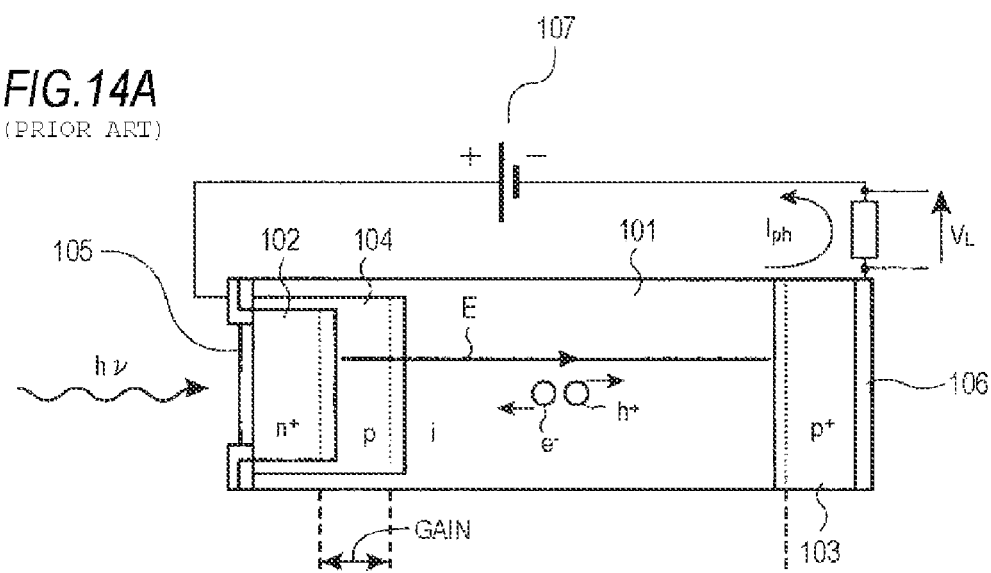
FIG. 14A is a sectional view illustrating the structure of a general avalanche photodiode and FIG. 14B is a diagram illustrating the strength of an electric field in the depth direction in the structure shown in FIG. 14A.
Figure 14B:
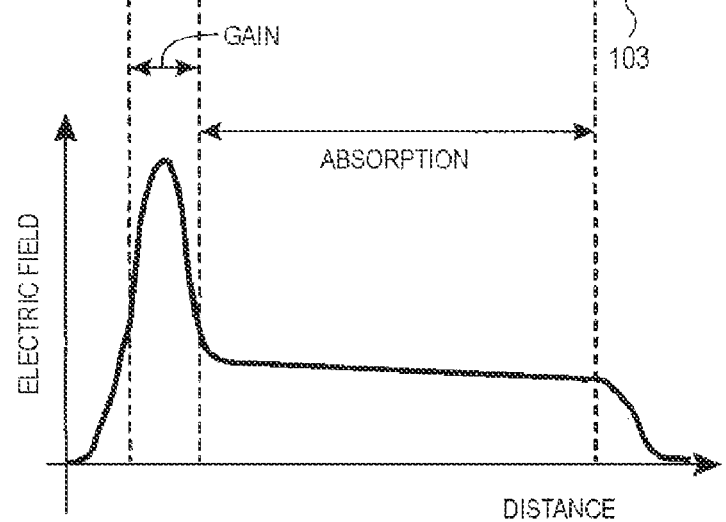

A sectional view illustrating the structure of a standard avalanche photodiode is shown in FIG. 14A. The magnitude of an electric field in the depth direction in the structure shown in FIG. 14A is shown in FIG. 14B.

As shown in FIG. 14A, an i-type semiconductor region of a substrate is used as an avalanche and absorption region 101, an $n^+$ region 102 is formed in the top of the substrate, and a p-type avalanche region 104 is formed under the $n^+$ region. A $p^+$ region 103 is formed in the bottom of the substrate. A transparent electrode 105 is formed on the top surface of the substrate and an electrode 106 is formed on the bottom surface of the substrate. A voltage $V_L$ is applied between the transparent electrode 105 and the electrode 106 from a power source 107 so that the transparent electrode 105 has a + potential, thereby forming an electric field.

The depths of the avalanche regions 101 and 104 are set depending on the wavelength of light to be detected.

In the avalanche photodiode, light (energy $h\upsilon$) is incident and electrons $e^-$ and holes $h^+$ are generated from photons in the i-type avalanche region 101. The electrons $e^-$ migrate to the transparent electrode 105 and are swept out from the avalanche region 101 to the p-type region 104. The holes $h^+$ migrate to the electrode 106. As a result, current $I_{ph}$ flows.

As shown in FIG. 14B, the electric field is strengthened in the vicinity of the p-type region 104 to generate a gain. The electric field is almost constant in the avalanche region 101.

A high electric field gradient is maintained in the p-type region 104 to accelerate the electrons $e^-$ as carriers and plural carriers are generated by the impact ionization.

This structure of the avalanche photodiode has a problem that the voltage applied to the entire device is great. The magnitude of the voltage is proportional to the thickness of the semiconductor material between the electrodes 105 and 106 and is also proportional to the band gap of the semiconductor material.

Silicon has a dielectric breakdown voltage of $3\times10^5$ V/cm and requires a voltage of 90 V or more to cause the avalanche phenomenon in a non-doped silicon substrate with a thickness of 3 µm. It is possible to reduce the necessary voltage by doping the substrate with impurities, but a voltage of 30 to 60 V is necessary in this case.

On the contrary, the driving voltage of a standard CMOS device is 10 V or less.

Accordingly, it is difficult to treat the voltage of 30 to 60 V in the CMOS device. As a result, it is difficult to apply the avalanche photodiode having the structure shown in FIG. 14A to a CMOS image sensor (CMOS type solid-state imaging device).

To solve the above-mentioned problem, according to an embodiment of the invention, there is provided a solid-state imaging device having a new configuration of an avalanche photodiode, which is small-sized and driven with a low voltage and which can be used in designing a standard CMOS image sensor without greatly changing a pixel design.

That is, a structure including an n+ region, a p+ region, and an avalanche region interposed between the n+ region and the p+ region in which the avalanche region is formed to extend in the thickness direction of the semiconductor substrate having the avalanche region formed therein is repeatedly disposed in each pixel.

The avalanche region is formed to extend in the thickness direction of a semiconductor base (such as a semiconductor substrate or an epitaxial layer on the semiconductor substrate). That is, the avalanche region is formed to extend in a direction (a vertical direction or a direction slightly tilted about the vertical direction) substantially perpendicular to the main surface of the semiconductor base or the substrate surface of the semiconductor substrate.

By forming the avalanche region to extend in the thickness direction of the semiconductor base, the avalanche region can be formed deep in the thickness direction of the semiconductor base and can be set to detect light of a wavelength to be detected. For example, when visible light is detected, it is possible to form the avalanche region with a thickness of about 3 μm.

By disposing plural structures including the n+ region, the p+ region, and the avalanche region interposed between the n+ region and the p+ region in each pixel, the width of the avalanche region between the n+ region and the p+ region can be reduced to a half or less of that in the case including only one structure. Accordingly, compared with the case where only one avalanche region shown in FIG. 14A is employed, the electric field necessary for causing the avalanche phenomenon can be formed with a lower applied voltage. For example, the electric field for causing the avalanche phenomenon can be formed with a voltage of 10 V which can be easily applied to the CMOS image sensor.

As the number of repeated structures increases, the width of the avalanche region can be reduced and thus the necessary applied voltage can be reduced. The upper limit of the number of repeated structures is determined depending on the pixel size and the minimum value of the pattern width which can be patterned with an ion implanting mask.

The n+ region, the p+ region, and the avalanche region interposed between the n+ region and the p+ region can be formed by ion-implanting n-type impurities or p-type impurities into the semiconductor base.

Silicon (Si) doped with n-type or p-type impurities can be used at the lowest cost as the semiconductor base. In this case, the width of the avalanche region and the applied voltage can be easily selected.

Of course, other semiconductor materials such as Ge, GaAs, InP, GaP, InAs, GaSb, and InSb may be used. Materials including three elements or four elements and having a greater band gap may be used.

When one selected from Ge, GaAs, InP, GaP, InAs, GaSb, and InSb is used as the material, the magnitude of the band gap of the semiconductor material is equal to or less than that of silicon. Accordingly, the width of the avalanche region and the applied voltage can be easily selected.

The avalanche region is an important parameter for determining the dielectric breakdown voltage of the entire device and thus influences the device the most.

The avalanche region is constructed by a region doped with low-concentration impurities (n-type or p-type) or a non-doped region.

The driving voltage of the device including the solid-state imaging device is set to form a desired electric field depending on the width of the avalanche region.

Figure 10:
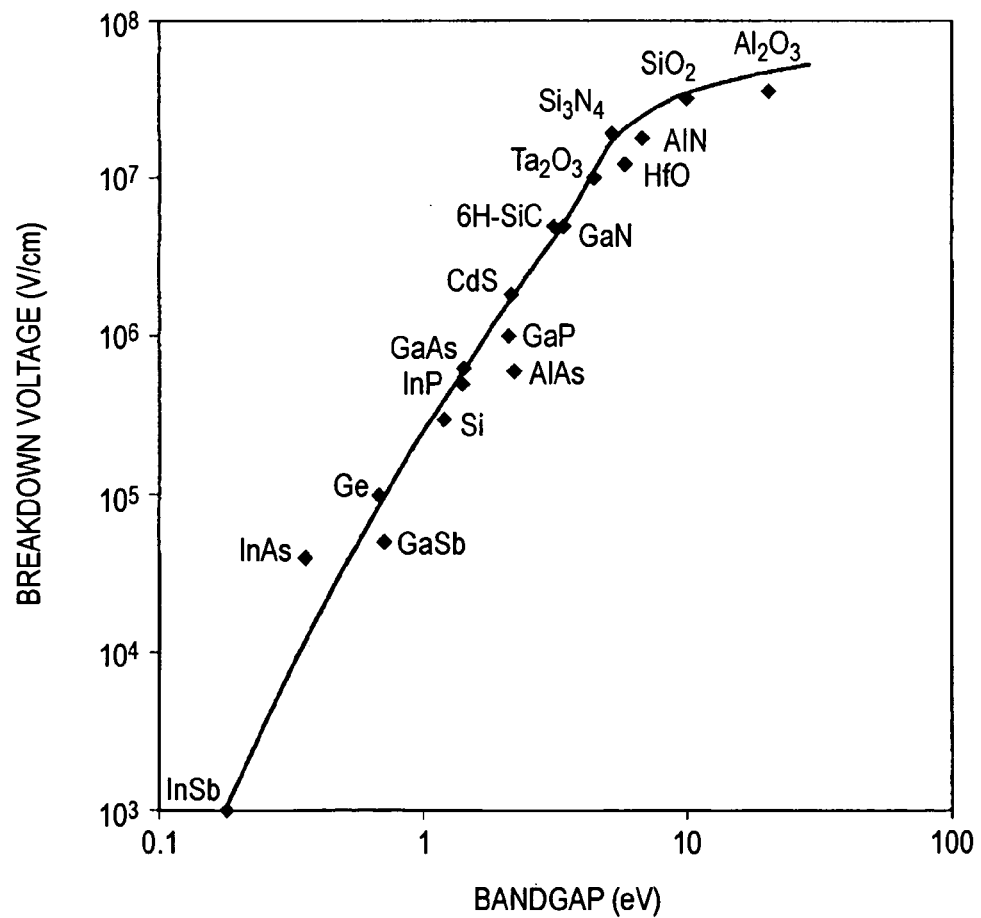
FIG. 10 is a diagram illustrating a relation between a band gap of a material and a dielectric breakdown voltage.

Here, the relation between the band gap of the material and the dielectric breakdown voltage is shown in FIG. 10.

It can be seen from FIG. 10 that the band gap is directly associated with the dielectric breakdown voltage and the dielectric breakdown voltage increases as the band gap is widened.

It may be thought that the use of a material having a very narrow band gap is only a problem of determination.

However, when the band gap at the room temperature is excessively narrow, it should be noted that the S/N ratio of the device is small by heat dissipation of the carriers into the bulk material at the background level of the device, thereby causing undesirable quality.

The absorption spectrum of the material is very important. The device should respond to the light with a wavelength to be detected and the response is determined depending on the absorption of the material at the wavelength.

Accordingly, when the band gap of a material is excessively wide, the material transmits the incident light and thus does not respond to a signal of the wavelength.

When the band gap is excessively narrow, the range of the detectable wavelength is widened and light not wanted to be detected is recorded. Accordingly, a particular cut-off filter is necessary for compensating for it. By these needs, silicon is generally selected for a light-receiving element receiving light in a visible ray band. As a result, a semiconductor material having a band gap close to that of silicon can be selected as a possible material.

The influence of the width of the avalanche region on the dielectric breakdown voltage will be described below.

Figure 11:
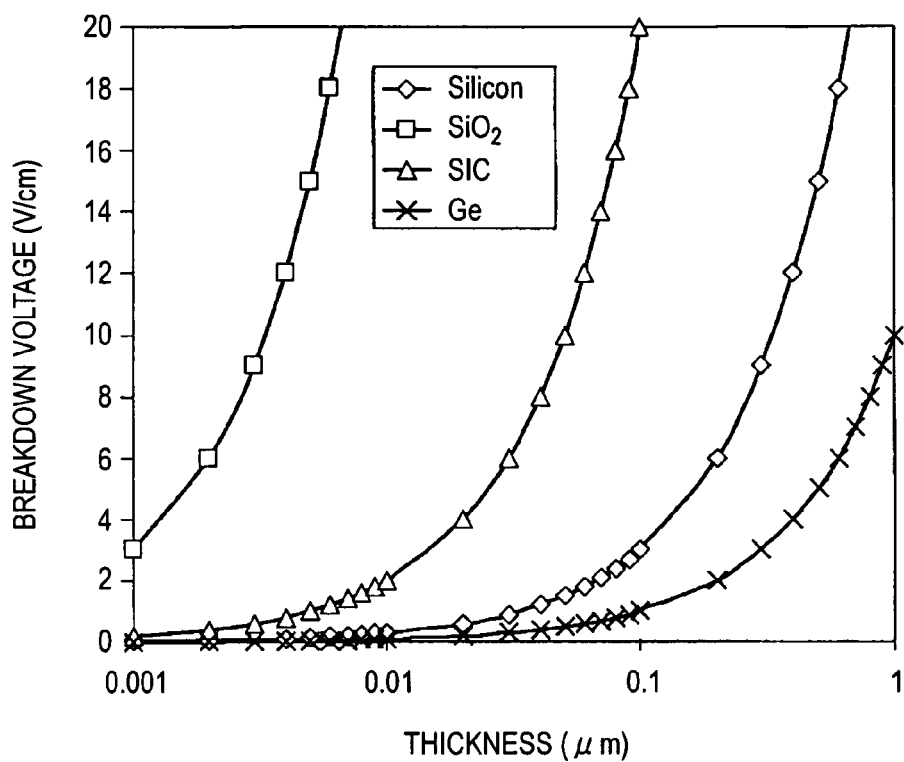
FIG. 11 is a diagram illustrating a relation between the thickness of a material and the dielectric breakdown voltage.

The relation between the thickness of the material and the dielectric breakdown voltage is shown in FIG. 11. Here, four representative materials of Ge, Si, SiC, and $SiO_2$ are shown.

It can be seen from FIG. 11 that the dielectric breakdown voltage exponentially increases with an increase in thickness of any material. This serves as a factor for restricting the driving voltage in design of a general avalanche diode.

That is, in the general avalanche diode shown in FIG. 14A, a thickness of 2 μm or more is necessary for raising the output up to a necessary level, and a voltage of 30 V or more is necessary for silicon. Since this voltage is too high for a standard CMOS chip to endure, the technique can hardly be applied to the CMOS image sensor.

On the other hand, since the width of the avalanche region in the solid-state imaging device according to the embodiment of the invention corresponds to the thickness of a semiconductor material shown in the horizontal axis of FIG. 11, the width of the avalanche region is determined depending on the necessary dielectric breakdown voltage and the used semiconductor material.

In the case of $SiO_2$ having a wide band gap, a thickness of 3 nm or less is necessary for reducing the voltage to 10 V or less and such a thickness is thus too small for stability of processes.

In the case of SiC, a thickness of 40 nm or less is necessary for reducing the voltage to 10 V or less and distortion remains in the usable manufacturing processes.

In the case of silicon, a thickness of 250 nm or less is necessary for reducing the voltage to 10 V or less. This thickness is physically possible and thus the material such as silicon can be suitably used in the invention.

In the case of Ge having a narrower band gap, a still greater thickness of 1 μm is allowable.

In this way, the materials from Si to Ge having neighboring band gaps can be used as the material of the avalanche region. Examples thereof include Ge, GaAs, InP, GaP, InAs, GaSb, and InSb.

Figure 12:
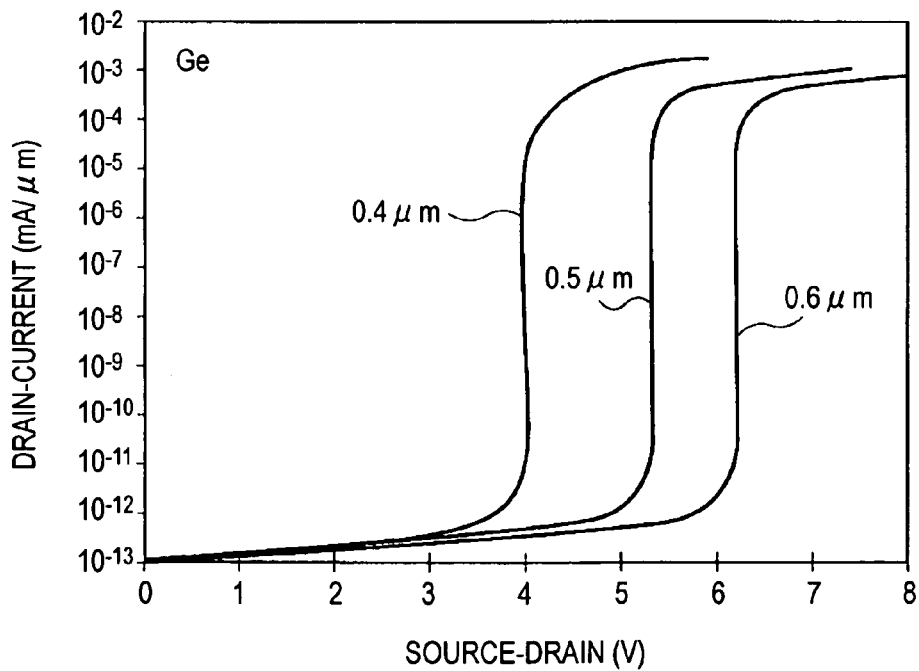
FIG. 12 is a diagram illustrating a current-voltage curve of Ge with various thicknesses.

Current-voltage curves of Ge with various thicknesses are shown in FIG. 12. The thicknesses are 0.4 μm, 0.5 μm, and 0.6

μm. The horizontal axis represents the source-drain voltage of a semiconductor device employing Ge and the vertical axis represents the drain current of the semiconductor device employing Ge.

As shown in FIG. 12, it can be seen that a low voltage of 4 to 6 V is realized with a thickness of 0.4 μm to 0.6 μm which can be easily formed.

Accordingly, when a material such as Ge having a narrow band gap is used, it can be seen that the material associated with a noise resulting from heat, but a low-voltage avalanche diode can be easily manufactured.

Figure 13:
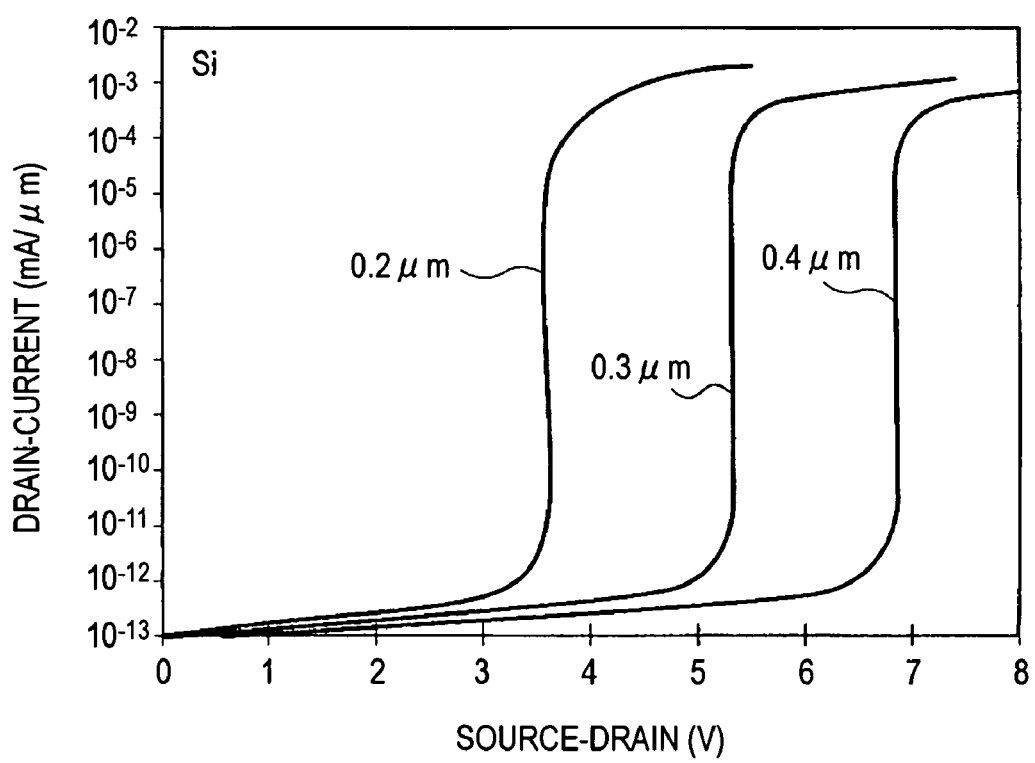
FIG. 13 is a diagram illustrating a current-voltage curve of Si with various thicknesses.

Similarly, current-voltage curves of Si with various thicknesses are shown in FIG. 13. The thicknesses are 0.2 μm, 0.3 μm, and 0.4 μm.

As shown in FIG. 13, to obtain the dielectric breakdown voltage necessary for Si, it is necessary to further reduce the thickness (the width of the avalanche region) than that of Ge.

For all, since the process techniques are being most advanced and the level of the background noise is low still, silicon is selected as the best material.

In the embodiment of the invention, the width of the avalanche region interposed between the n+ region and the p+ region is preferably in the range of 0.05 μm to 1 μm.

By setting the width of the avalanche region to 0.05 μm or more, the regions of the avalanche diode can be easily formed by the ion implantation using a general mask.

By setting the width of the avalanche region to 1 μm or less, it is possible to reduce the necessary voltage even with a small pixel size of about 2 μm, compared with the structure shown in FIG. 14A.

2. Solid-State Imaging Device According to First Embodiment

A specific embodiment of the invention will be described now.

Figure 1:
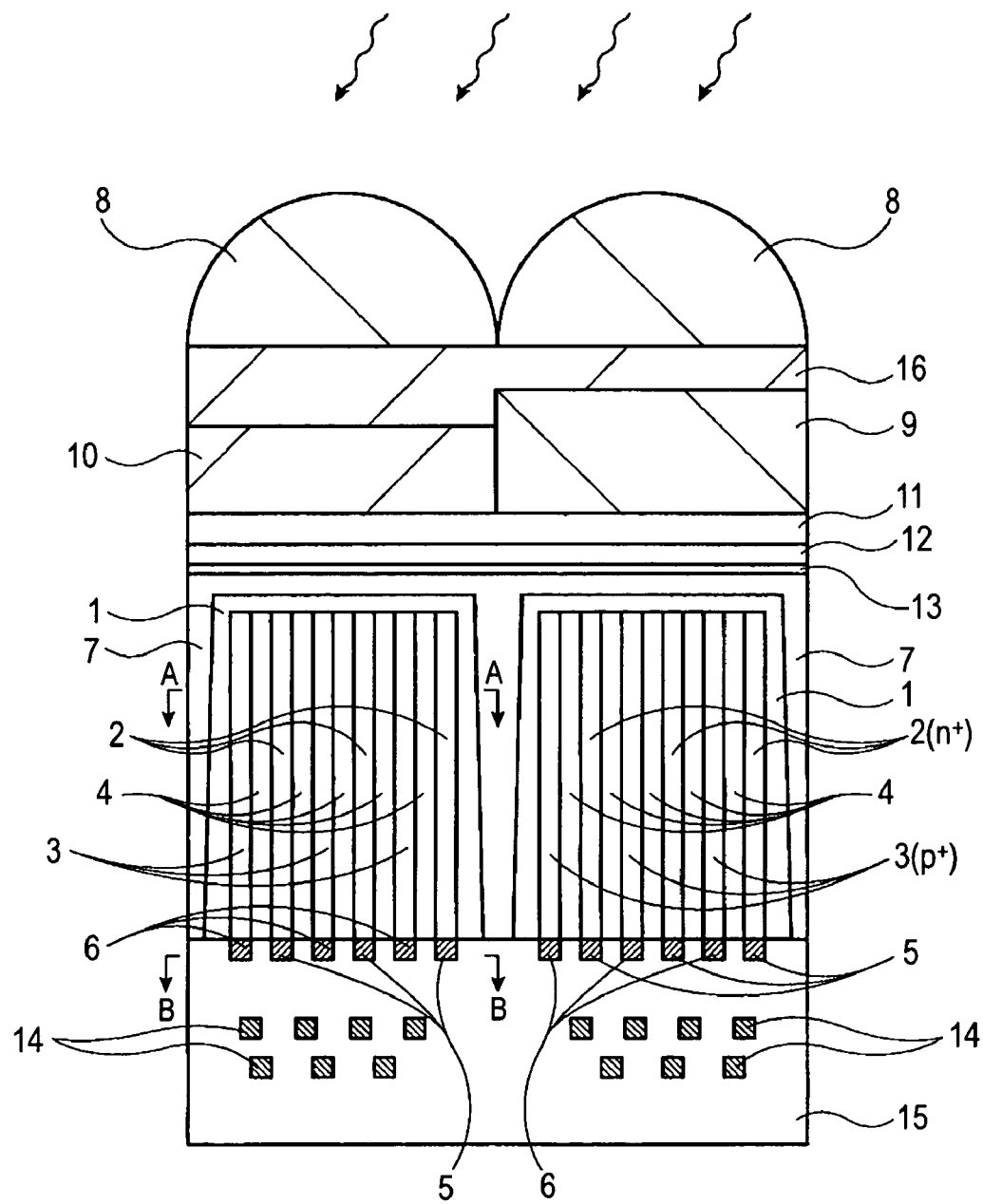
FIG. 1 is a diagram (sectional view) schematically illustrating a configuration of a solid-state imaging device according to a first embodiment of the invention.

A diagram (sectional view) schematically illustrating a solid-state imaging device according to a first embodiment of the invention is shown in FIG. 1.

In the solid-state imaging device, an n-type well layer 1 is formed in a p-type semiconductor substrate 7 and a photodiode constituting a pixel is formed in the n-type well layer 1.

The n-type well layer 1 is formed in an island shape for each pixel.

A transmissivity and refractive index adjusting layer 13, a passivation layer 12, and a transmissivity and refractive index adjusting layer 11 are stacked on the semiconductor substrate 7 and color filters 9 and 10 of colors corresponding to the pixels are formed thereon.

An on-chip lens is formed on the color filters 9 and 10 with a planarization layer 16 interposed therebetween.

On the other hand, an insulating layer 15 is formed under the semiconductor substrate 7 and metal interconnection layers 14 are formed in the insulating layer 15.

The metal interconnection layers 14 are insulated by the insulating layer 15.

In this solid-state imaging device, the insulating layer 15 in which the metal interconnection layers 14 are formed, and the color filters 9 and 10 and the on-chip lens 8 are formed on the opposite main surfaces of the semiconductor substrate 7 in which the photodiode is formed. That is, a rear illuminating structure in which light is applied from the opposite side of the top surface of the substrate in which the interconnections are formed.

In this embodiment, the avalanche photodiode structure of the n+ region 2/the avalanche region 4/the p+ region 3 extending in the thickness direction of the semiconductor substrate 7 is repeatedly formed in each pixel.

The n+ region 2, the avalanche region 4, and the p+ region 3 are formed in the n-type well layer 1 to extend in the thickness direction (the up and down direction in FIG. 1) of the semiconductor substrate 7. The avalanche photodiode has a structure in which interposing the avalanche region 4 is interposed between the n+ region 2 and the p+ region 3.

As shown in FIG. 1, the structure of the n+ region 2/the avalanche region 4/the p+ region 3 shares the n+ region 2 or the p+ region 3 with the neighboring structures. Accordingly, five avalanche regions 4 in total can be formed with three n+ regions 2 and three p+ regions 3.

The n+ regions 2 are connected to electrodes (cathode electrodes) 5 formed in the lower insulating layer 15.

The p+ regions 3 are connected to electrodes (anode electrodes) 6 formed in the lower insulating layer 15.

The electrodes (cathode electrodes) 5 are connected to each other in a place other than the section shown in FIG. 1 and are supplied with the same potential. The same is true in the electrodes (anode electrodes) 6.

Three regions 2, 3, and 4 constituting the avalanche diode have top surfaces with almost the same height and the top surfaces are covered with the n-type well layer 1 and the semiconductor substrate 7.

Figure 2A:
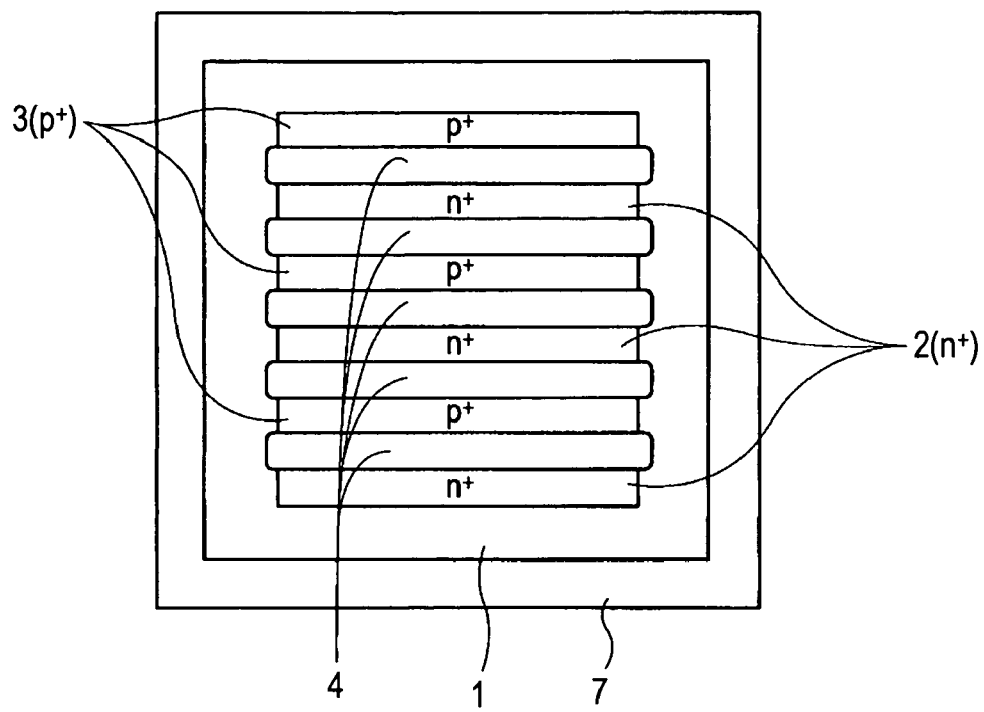
FIG. 2A is a sectional view taken along line A-A of FIG. 1
Figure 2B:
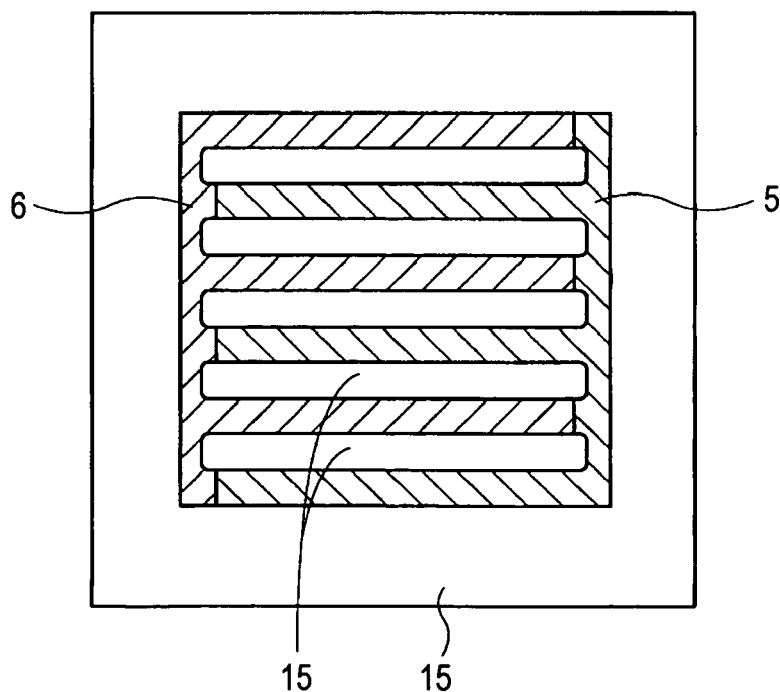
FIG. 2B is a sectional view taken along line B-B of FIG. 1.

The horizontal sectional view taken along line A-A of FIG. 1 is shown in FIG. 2A and the horizontal sectional view taken along line B-B is shown in FIG. 2B. In FIGS. 2A and 2B, the up and down direction of the drawings corresponds to the left and right direction of FIG. 1, and the left and right direction of the drawings corresponds to the direction perpendicular to the paper surface of FIG. 1.

As shown in FIG. 2A, the avalanche diode structure of the n+ region 2/the avalanche region 4/the p+ region 3 shares the n+ region 2 or the p+ region 3 with the neighboring structures and is repeatedly formed. Three regions 2, 3, and 4 constituting the avalanche diode extend in parallel in the sectional view of FIG. 1 and the sectional view of FIG. 2A.

The relation between the voltage (potential difference) applied to the n+ region 2 and the p+ region 3 and the electric field formed thereby is determined depending on the width of the avalanche region 4 in FIGS. 1 and 2A. As the width of the avalanche region 4 decreases, the necessary voltage can decrease. It is preferable that the width of the avalanche region 4 is in the above-mentioned range of 0.05 μm and 1 μm.

As shown in FIG. 2B, the electrodes 5 connected to the n+ regions 2 and the electrodes 6 connected to the p+ regions 3 are formed in a comb shape and have teeth portions connected to the n+ region 2 or the p+ region 3 and a connection portion connecting the teeth portions. The lower portion of the avalanche region 4 is not connected to the electrodes 5 and 6 and thus formed by the insulating layer 15 similarly to the neighboring portion.

Silicon doped with n-type or p-type impurities can be used in the semiconductor substrate 7. Ge, GaAs, InP, GaP, InAs, GaSb, and InSb and semiconductor materials having three elements or four elements and having a wider band gap may be also used.

The avalanche region 4 is constructed by a region doped with low-concentration impurities (n-type or p-type) or a non-doped region, as described above.

Three regions 2, 3, and 4 constituting the avalanche diode can be formed by ion-implanting n-type impurities or p-type impurities into the n-type well layer 1 formed in each pixel using a mask corresponding to the patterns of the regions.

According to the embodiment, the avalanche photodiode structure of the n+ region 2/the avalanche region 4/the p+ region 3 each extending in the thickness direction of the semiconductor substrate 7 is repeatedly formed in each pixel.

By forming the avalanche region 4 to extend in the thickness direction of the semiconductor substrate 7, the avalanche region can be formed deep in the thickness direction of the semiconductor substrate 7 and the depth of the avalanche region 4 can be set to detect light of a wavelength to be detected. Accordingly, the incident light can be satisfactorily absorbed and plural carriers can be generated from photons by the avalanche phenomenon.

By repeatedly forming the avalanche photodiode structure in each pixel, the width of the avalanche region 4 between the $n^+$ region 2 and the $p^+$ region 3 can be reduced to a half or less of that in the case having only one structure. Accordingly, it is possible to reduce the applied voltage necessary for causing the avalanche phenomenon. On the other hand, when a comparison is made with the same application voltage, the electric field applied to the avalanche region 4 can be more strengthened than that in the case with only one structure, thereby increasing the number of carriers generated from one photon.

Since the necessary applied voltage can be reduced, it is possible to suppress the generation of a crosstalk with the neighboring pixels or the generation of heat. Accordingly, it is not necessary to employ a thick insulating separation region or the Peltier device and it is possible to reduce the size of the pixels in the solid-state imaging device.

Accordingly, it is possible to reduce the pixel size in the solid-state imaging device including the avalanche photodiodes in the pixels.

It is possible to apply the avalanche photodiode to the CMOS image sensor having a relatively-low driving voltage.

When a comparison is made with the same applied voltage, the electric field applied to the avalanche region 4 can be strengthened, thereby increasing the number of carriers generated from one photon. Accordingly, it is possible to improve the response performance to the low light intensity.

Therefore, it is possible to improve the sensitivity to the low light intensity with a wide dynamic range maintained.

In this embodiment, the top surfaces of three regions 2, 3, and 4 constituting the avalanche diode are uniform in height. Accordingly, since an almost uniform electric field is applied to the entire avalanche region 4, the number of carriers increases similarly in the depth direction of the avalanche region 4.

3. Solid-State Imaging Device According to Second Embodiment

The entire sectional view of the solid-state imaging device has been shown in the first embodiment, but the upper layer and the lower layer of the semiconductor substrate 7 are not shown in the following embodiments. The upper layer and the lower layer of the semiconductor substrate 7 may have the same configurations as the first embodiment.

Figure 3:
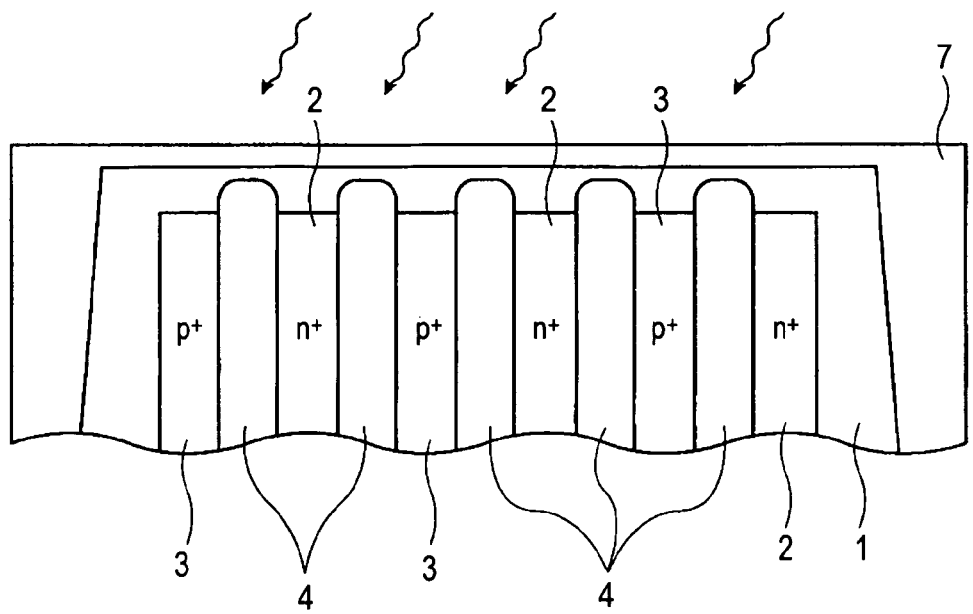
FIG. 3 is a partial sectional view illustrating a solid-state imaging device according to a second embodiment of the invention.

A sectional view illustrating a main part (part of the semiconductor substrate 7) of a solid-state imaging device according to a second embodiment of the invention is shown in FIG. 3. In FIG. 3, the sectional view of a part of a light incidence side (rear side) of a pixel of the semiconductor substrate 7 is shown.

In the first embodiment, as shown in FIG. 1, the top surfaces of three regions 2, 3, and 4 constituting the avalanche diode have substantially the uniform height and the top surfaces are covered with the well layer 1 and the semiconductor substrate 7.

On the contrary, in the second embodiment, the avalanche region 4 protrudes to the light incidence side more than the $n^+$ region 2 and the $p^+$ region 3, as shown in FIG. 3.

The top surface of the avalanche region 4 is covered with the n-type well layer 1 and the semiconductor substrate 7, similarly to the first embodiment.

The other configuration is the same as the first embodiment and thus the description thereof is not repeated.

In this configuration, the avalanche phenomenon occurs mainly in the vicinity of the lower portion of the avalanche region 4. Since the $n^+$ region 2 and the $p^+$ region 3 are not formed in the vicinity of the top surface of the avalanche region 4, the avalanche phenomenon does not occur from the carriers in the vicinity of the top which are not exposed to a high electric field. Since the carriers are hardly generated in the vicinity of the semiconductor substrate 7, the leakage of carriers in the top surface of the semiconductor substrate 7 is small.

On the other hand, light having a relatively short wavelength is absorbed by the vicinity of the top surface of the semiconductor substrate 7 and thus is subjected to small amplification.

4. Solid-State Imaging Device According to Third Embodiment

Figure 4:
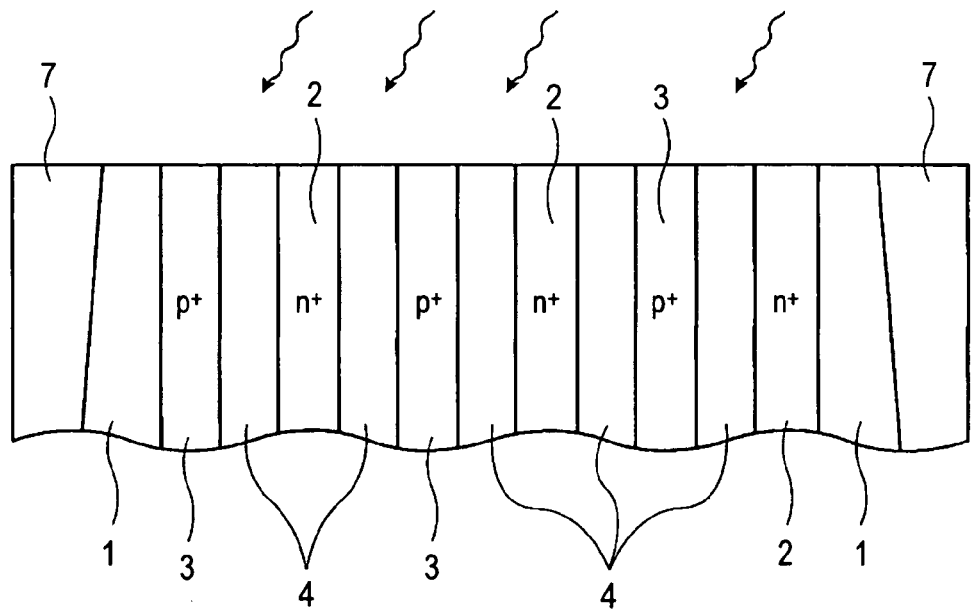
FIG. 4 is a partial sectional view illustrating a solid-state imaging device according to a third embodiment of the invention.

A sectional view illustrating a main part (a part of the semiconductor substrate 7) of a solid-state imaging device according to a third embodiment of the invention is shown in FIG. 4.

As shown in FIG. 4, three regions 2, 3, and 4 constituting the avalanche diode are formed up to the top surface of the semiconductor substrate 7 in the third embodiment.

The other configuration is the same as the first embodiment and the description thereof is not repeated.

In this case, three regions 2, 3, and 4 constituting the avalanche diode are formed up to the top surface of the semiconductor substrate 7. Accordingly, plural carriers can be generated from one photon based on light having a relatively short wavelength (the vicinity of blue of visible rays or ultraviolet rays) by the avalanche phenomenon. That is, it is possible to improve the sensitivity to the light having a relatively short wavelength.

Since the color filters 9 and 10 or the on-chip lenses 8 exist on the semiconductor substrate 7 and the light having a relatively short wavelength is slightly absorbed by the portions, the incident light is not used entirely in the avalanche phenomenon in this embodiment.

The top surfaces of three regions 2, 3, and 4 of the avalanche diode are equal in height to the top surface of the semiconductor substrate 7 and the top surfaces of three regions 2, 3, and 4 are uniform in height. Accordingly, since almost a uniform electric field is applied to the entire avalanche region 4, the carriers increase similarly in the depth direction of the avalanche region 4.

However, since three regions 2, 3, and 4 of the avalanche diode are formed up to the top surface of the semiconductor substrate 7, it is thought that the carriers leak between the neighboring pixels in the vicinity of the top surface of the semiconductor substrate 7. Particularly, when a defect or an interface potential exists in the vicinity of the top surface of the semiconductor substrate 7, the leakage of carriers is easily caused.

When the amount of noises due to the leakage of carriers is sufficiently smaller than the amount of signals, the configuration according to this embodiment may be employed without any particular problem.

To obtain the configuration according to the third embodiment, the n-type well layer 1 is formed up to the top surface of the semiconductor substrate 7 and then three regions 2, 3, and 4 are formed to reach the top surface of the semiconductor substrate 7.

The ion implantation for forming three regions 2, 3, and 4 is carried out from the bottom surface (surface) of the semiconductor substrate 7 in the first embodiment or the second embodiment, but can be carried out from the top surface (back surface) of the semiconductor substrate 7 in this embodiment.

5. Solid-State Imaging Device According to Fourth Embodiment

Figure 5:
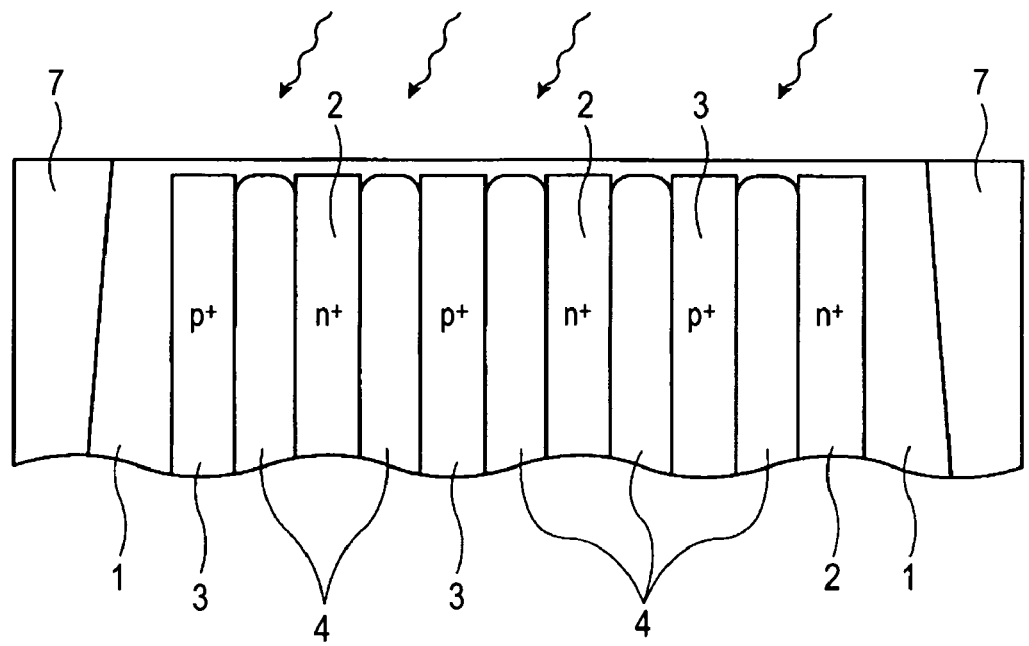
FIG. 5 is a partial sectional view illustrating a solid-state imaging device according to a fourth embodiment of the invention.

A sectional view illustrating a main part (a part of the semiconductor substrate 7) of a solid-state imaging device according to a fourth embodiment of the invention is shown in FIG. 5.

As shown in FIG. 5, in the fourth embodiment of the invention, three regions 2, 3, and 4 of the avalanche diode are formed up to the vicinity of the top surface of the semiconductor substrate 7. The n-type well layer 1 is formed up to the top surface of the semiconductor substrate 7. The well layer 1 between the top surfaces of three regions 2, 3, and 4 and the top surface of the semiconductor substrate 7 is very thin.

The other configuration is the same as the first embodiment and thus the description thereof is not repeated.

In this configuration, three regions 2, 3, and 4 of the avalanche diode are formed up to the vicinity of the top surface of the semiconductor substrate 7. Accordingly, plural carriers can be generated from one photon based on light having a relatively short wavelength (the vicinity of blue of visible rays or ultraviolet rays) by the avalanche phenomenon.

Since three regions 2, 3, and 4 are apart from the top surface of the semiconductor substrate 7 by the thickness of the n-type well layer 1, it is possible to suppress the leakage of carriers due to a defect or an interface potential in the vicinity of the top surface of the semiconductor substrate 7.

However, compared with the third embodiment, the sensitivity of the light having a relatively short wavelength is deteriorated by the thickness of the thin well layer 1 covering the top surfaces of three regions 2, 3, and 4.

6. Solid-State Imaging Device According to Fifth Embodiment

Figure 6:
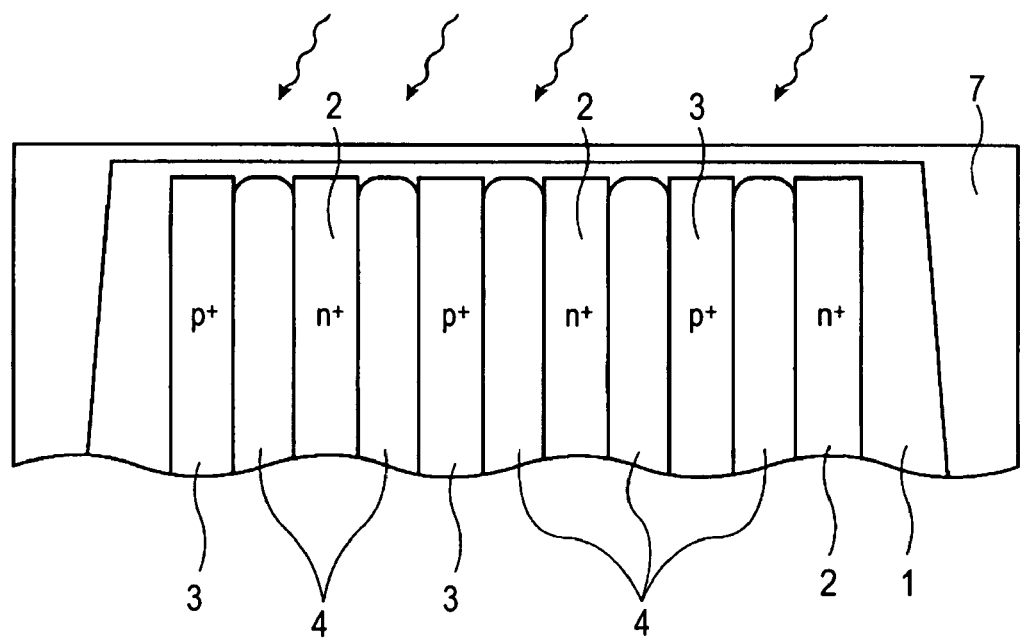
FIG. 6 is a partial sectional view illustrating a solid-state imaging device according to a fifth embodiment of the invention.

A sectional view illustrating a main part (a part of the semiconductor substrate 7) of a solid-state imaging device according to a fifth embodiment of the invention is shown in FIG. 6.

As shown in FIG. 6, in the fifth embodiment of the invention, three regions 2, 3, and 4 of the avalanche diode are formed up to the vicinity of the top surface of the semiconductor substrate 7. The n-type well layer 1 is formed up to the top surface of the semiconductor substrate 7. The well layer 1 and the semiconductor substrate 7 between the top surfaces of three regions 2, 3, and 4 and the top surface of the semiconductor substrate 7 are very thin.

That is, in the configuration according to the fifth embodiment, the semiconductor substrate 7 further covers the top surface of the well layer 1, compared with the fourth embodiment. Compared with the first embodiment, the well layer 1 and the semiconductor substrate 7 covering three regions 2, 3, and 4 are very thin.

In this configuration, three regions 2, 3, and 4 of the avalanche diode are formed up to the vicinity of the top surface of the semiconductor substrate 7. Accordingly, plural carriers can be generated from one photon based on light having a relatively short wavelength (the vicinity of blue of visible rays or ultraviolet rays) by the avalanche phenomenon.

Since three regions 2, 3, and 4 are formed apart from the top surface of the semiconductor substrate 7 by the thicknesses of the n-type well layer 1 and the semiconductor substrate 7, it is possible to suppress the leakage of carriers due to the defect or the interface potential in the vicinity of the top surface of the semiconductor substrate 7.

However, compared with the third embodiment, the sensitivity of the light having a relatively short wavelength is deteriorated by the thicknesses of the thin well layer 1 and the semiconductor substrate 7 covering the top surfaces of three regions 2, 3, and 4. On the other hand, the sensitivity of the light having a relatively short wavelength is improved, compared with the first embodiment.

By the distance from the top surfaces of three regions 2, 3, and 4 of the avalanche diode to the top surface of the semiconductor substrate 7, the leakage of carriers and the sensitivity of the light having a relatively short wavelength have a trade-off relation.

A configuration with a necessary characteristic can be selected from the above-mentioned configurations according to the first to fifth embodiments on the basis of necessary characteristics of a solid-state imaging device and design conditions such as a pixel size.

7. Modified Examples

In the first to fifth embodiments, three regions 2, 3, and 4 of the avalanche diode are formed in the planar pattern shown in FIG. 2A.

In the invention, the planar pattern of three regions of the avalanche photodiode is not limited to the pattern shown in FIG. 2A, but may employ other patterns.

Modified examples of the planar pattern of three regions 2, 3, and 4 are described below.

Figure 7A:
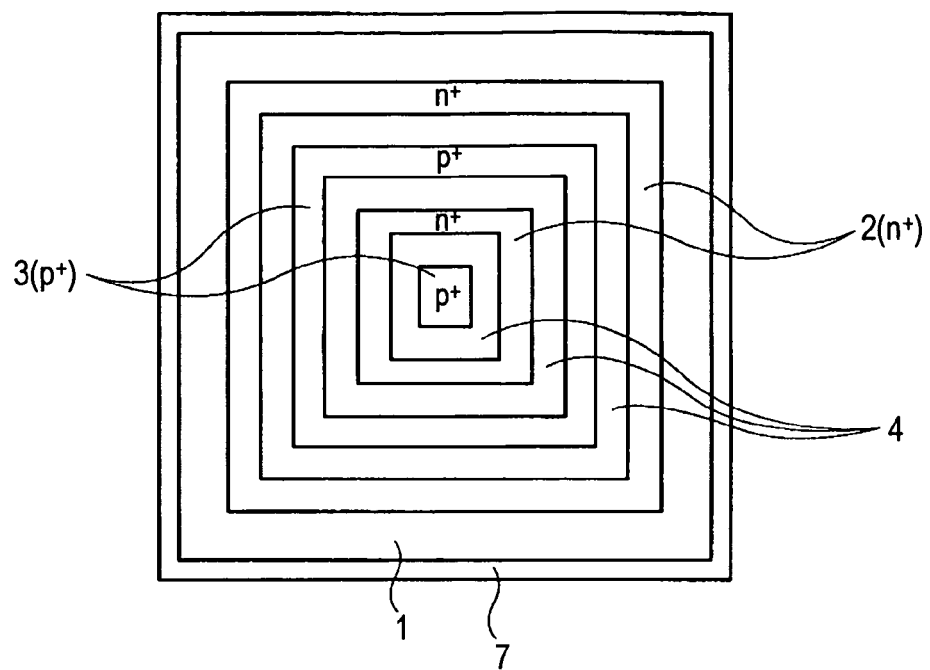
FIGS. 7A and 7B are diagrams illustrating modified examples in which a planar pattern of an avalanche photodiode is modified.

A first modified example of the planar pattern of three regions 2, 3, and 4 of the avalanche photodiode is shown in FIG. 7A. In the first modified example, a planar pattern of the electrodes 5 and 6 corresponding to FIG. 2B is shown in FIG. 7B.

As shown in FIG. 7A, the $p^+$ region 3 is formed in a rectangular pattern at the center of a pixel and three regions 2, 3, and 4 are patterned to sequentially surround the rectangular pattern in a frame shape. Two $n^+$ regions 2, two $p^+$ regions 3, and three avalanche regions 4 are formed.

Figure 7B:
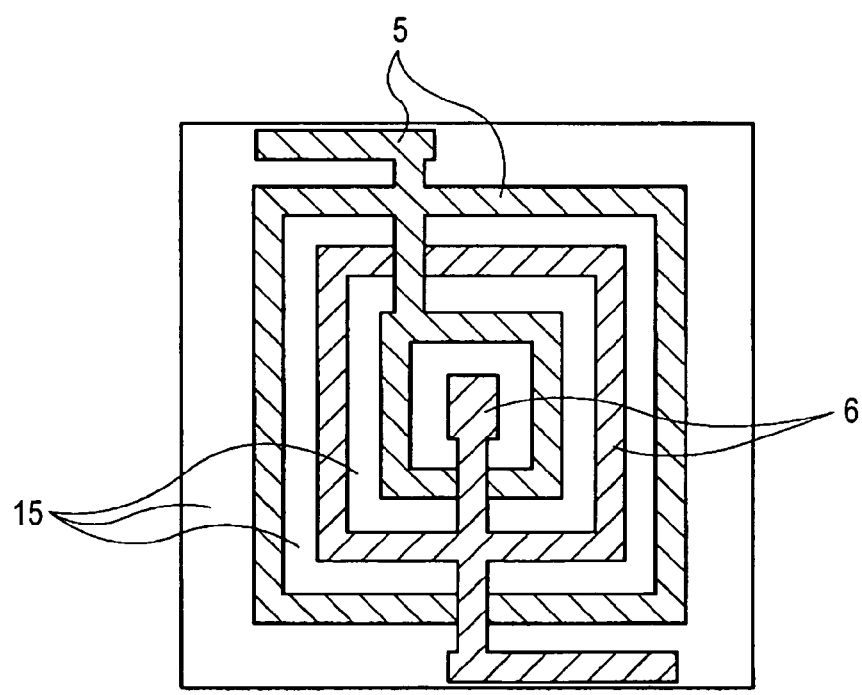

As shown in FIG. 7B, the portions of the electrodes 5 and 6 connected to the $n^+$ regions 2 or the $p^+$ regions 3 are electrically connected by a connection portion from the center of a pixel to the outside. A drawn electrode portion for connection to an interconnection is formed in the vicinity of the circumference of the pixel.

Figure 8A:
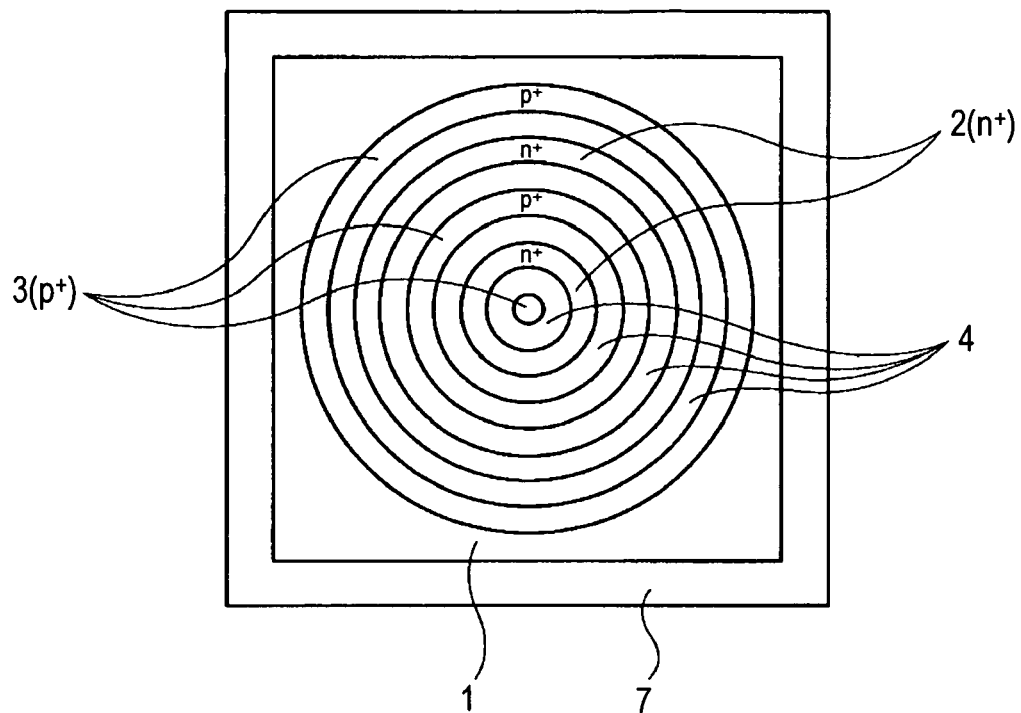
FIGS. 8A and 8B are diagrams illustrating modified examples in which the planar pattern of the avalanche photodiode is modified.

A second modified example of the planar pattern of three regions 2, 3, and 4 of the avalanche photodiode is shown in FIG. 8A. In the second modified example, a planar pattern of the electrodes 5 and 6 corresponding to FIG. 2B is shown in FIG. 8B.

As shown in FIG. 8A, the $p^+$ region 3 is formed in a circular pattern at the center of a pixel and three regions 2, 3, and 4 are patterned to sequentially surround the circular pattern in a coaxial circle shape. Two $n^+$ regions 2, three $p^+$ regions 3, and four avalanche regions 4 are formed.

Figure 8B:
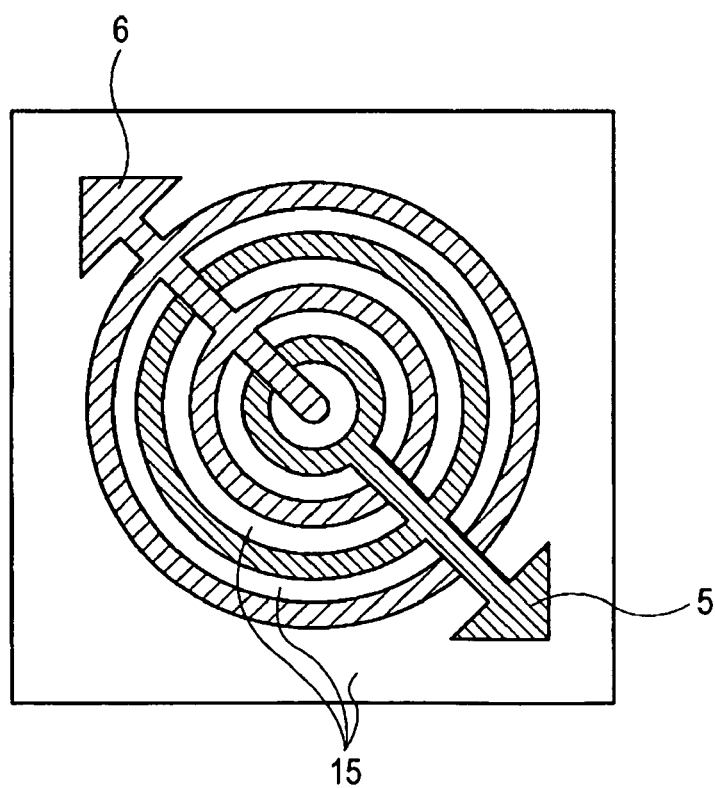

As shown in FIG. 8B, the portions of the electrodes and 6 connected to the $n^+$ regions 2 or the $p^+$ regions 3 are electrically connected by a connection portion from the center of a pixel to the outside. A triangular drawn electrode portion for connection to an interconnection is formed in the outside thereof.

In the planar patterns of these modified examples, the outermost region in the avalanche photodiode structure of each pixel is the $n^+$ region 2 in the first modified example and is the $p^+$ region 3 in the second modified example, which are the same for all the pixels. Accordingly, since the outermost regions of the neighboring pixels can be easily formed in the same conductive type, it is easy to insulate the pixels.

On the contrary, in the planar pattern shown in FIG. 2A, one end of the pixel is the $n^+$ region 2 and the other end is the $p^+$ region 3. In this planar pattern, when the opposed regions of the neighboring pixels are formed in the same conductive type, it is easy to insulate the pixels, but the planar patterns of the pixels are reverse. When the planar patterns of the pixels are the same as each other, the opposed regions has the reverse conductive types and thus it is necessary to sufficiently guarantee the isolation region between the pixels so as to prevent the leak current.

In the parallel planar pattern shown in FIG. 2A, by changing the number of three regions 2, 3, and 4 and setting both end regions of each pixel to the same conductive type, it is easy to insulate the pixels, similarly to the planar pattern shown in FIG. 7A or 8A.

In the invention, the planar pattern of three regions of the avalanche diode is not limited to the patterns shown in FIGS. 2A, 7A, and 8A, but may employ other planar patterns.

It is preferable that the planar pattern of three regions of the avalanche diode is formed by repeating a simple pattern, like the patterns shown in FIGS. 2A, 7A, and 8A. By repeating the simple pattern, it is easy to guarantee a margin for coping with misalignment of the ion implantation mask and to reduce the pattern width as much, thereby easily reducing the voltage. On the contrary, by forming a complex pattern, it is difficult to guarantee the margin for coping with the misalignment of the mask and to reduce the pattern width, which is disadvantageous.

The invention can be applied to various solid-state imaging devices such as a CCD solid-state imaging device (CCD image sensor) and a CMOS solid-state imaging device (CMOS image sensor).

It has been described in the above-mentioned embodiments that the n-type well layer 1 is formed in the p-type semiconductor substrate 7, but the conductive types may be reversed. That is, a p-type well layer may be formed in an n-type semiconductor substrate.

The rear illuminating structure has been described in the above-mentioned embodiments, but the invention may be applied to a solid-state imaging device with a front illuminating structure in which a semiconductor base is illuminated from the same side as the interconnection layer. When the invention is applied to the front illuminating structure, the width of the avalanche region can be reduced, thereby reducing the voltage for causing the avalanche phenomenon.

8. Camera

A camera according to an embodiment of the invention includes the solid-state imaging device according to the above-mentioned embodiments. Examples of the camera include a still camera, a video camera, and a mobile apparatus having a camera function.

An example of the camera will be described below.

Figure 9:
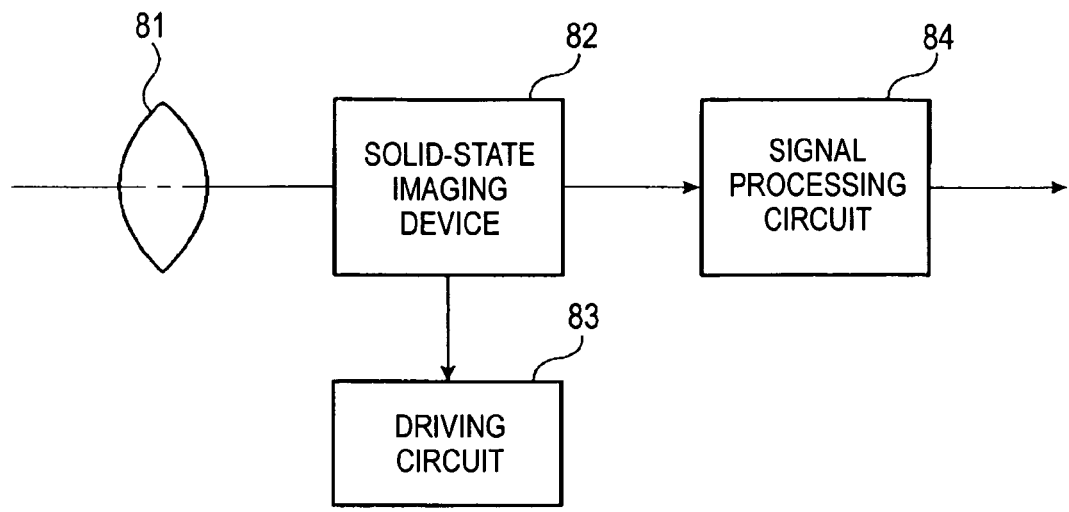
FIG. 9 is a block diagram illustrating a configuration of a camera according to an embodiment of the invention.

A diagram (block diagram) schematically illustrating the configuration of the camera according to an embodiment of the invention is shown in FIG. 9.

The camera according to this embodiment includes an optical system (focusing lens) 81, a solid-state imaging device 82, a driving circuit 83, and a signal processing circuit 84.

The solid-state imaging device 82 may be a CCD solid-state imaging device or a CMOS solid-state imaging device and employs the configuration (in which plural structures of the avalanche photodiode are repeatedly formed in a pixel) of the solid-state imaging device according to the embodiments of the invention.

The optical system (focusing lens 81) concentrates image light (incident light) from a subject onto an imaging plane of the solid-state imaging device 82. Accordingly, signal charges are accumulated in light-receiving portions (photodiodes) of the solid-state imaging device 82 for a predetermined time. The driving circuit 83 controls the operations of accumulating and reading the signal charges in the solid-state imaging device 82. The signal processing circuit 84 performs various signal processes on the output signals of the solid-state imaging device 82 and outputs the resultant signals. The camera according to this embodiment may be of a camera module type in which the optical system (focusing lens) 81, the solid-state imaging device 82, the driving circuit 83, and the signal processing circuit 84 are integrated in a module.

In the camera according to this embodiment, since the solid-state imaging device 82 employs the configuration of the solid-state imaging device according to the above-mentioned embodiments, it is possible to reduce the size of the pixels including the avalanche photodiode. Accordingly, it is possible to reduce the camera size or to increase the number of pixels in the solid-state imaging device 82.

The camera according to this embodiment may be combined with any of the solid-state imaging devices according to the first to fifth embodiments, or may be combined with the configuration of another solid-state imaging device.

The camera according to this embodiment may employ various configurations, not limited to the configuration shown in FIG. 9.

The invention is not limited to the above-mentioned embodiments, but may be modified in various forms without departing from the spirit and scope of the invention.

What is claimed is:

1. A solid-state imaging device comprising:
a plurality of pixels provided on a semiconductor base, wherein each pixel comprises an avalanche photodiode, the avalanche photodiode comprising a plurality of layers, wherein the plurality of layers comprises:
a plurality of n+ region layers;
a plurality of p+ region layers; and
a plurality of avalanche region layers,
wherein each avalanche region layer is provided between one n+ region layer and one p+ region layer,
wherein each n+ region layer is provided between two avalanche region layers, and
wherein each p+ region layer is provided between two avalanche region layers.

2. The solid-state imaging device according to claim 1, wherein an interconnection layer is formed on one main surface of the semiconductor base and light is caused to be incident on a light-receiving portion from another main surface of the semiconductor base.

3. The solid-state imaging device according to claim 1, wherein the semiconductor base is formed of silicon.

4. The solid-state imaging device according to claim 1, wherein the semiconductor base is formed of one material selected from Ge, GaAs, InP, GaP, InAs, GaSb, and InSb.

5. The solid-state imaging device according to claim 1, wherein a width of the avalanche region layer is in a range of 0.05 μm to 1 μm.

6. A camera for capturing an image comprising:
a solid-state imaging device including a plurality of pixels provided on a semiconductor base, wherein each pixel comprises an avalanche photodiode, the avalanche photodiode comprising a plurality of layers, wherein the plurality of layers comprises:
a plurality of n+ region layers;
a plurality of p+ region layers; and
a plurality of avalanche region layers,
wherein each avalanche region layer is provided between one n+ region layer and one p+ region layer,
wherein each n+ region layer is provided between two avalanche region layers, and
wherein each p+ region layer is provided between two avalanche region layers.

* * * * *